(12) United States Patent
Lin et al.

(10) Patent No.: US 10,847,210 B2
(45) Date of Patent: Nov. 24, 2020

(54) MEMORY DEVICE WITH FLY WORD LINE

(71) Applicant: Taiwan Semiconductor Manufacturing Company, Ltd., Hsinchu (TW)

(72) Inventors: Yangsyu Lin, Hsinchu (TW); Chiting Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/285,811

(22) Filed: Feb. 26, 2019

(65) Prior Publication Data

US 2019/0311765 A1    Oct. 10, 2019

Related U.S. Application Data

(60) Provisional application No. 62/654,977, filed on Apr. 9, 2018.

(51) Int. Cl.
| G11C 8/00 | (2006.01) |
| G11C 11/418 | (2006.01) |
| G11C 5/02 | (2006.01) |
| G11C 11/419 | (2006.01) |

(52) U.S. Cl.
CPC ............ G11C 11/418 (2013.01); G11C 5/025 (2013.01); G11C 11/419 (2013.01)

(58) Field of Classification Search
CPC ...... G11C 11/418; G11C 5/025; G11C 11/419
See application file for complete search history.

(56) References Cited

U.S. PATENT DOCUMENTS

| 6,738,279 B1 * | 5/2004 | Kablanian | G11C 5/025 365/230.03 |
| 6,741,492 B2 * | 5/2004 | Nii | G11C 11/4125 257/E27.099 |
| 9,368,215 B2 * | 6/2016 | La Rosa | G11C 16/10 |
| 9,632,951 B2 * | 4/2017 | Huang | G06F 12/1433 |

* cited by examiner

*Primary Examiner* — Pho M Luu
(74) *Attorney, Agent, or Firm* — Merchant & Gould P.C.

(57) ABSTRACT

A memory device includes a plurality of memory cells arranged in an array having a plurality of rows and a plurality of columns. A first word line is connected to a first plurality of the memory cells of a first row of the array, and a second word line is connected to a second plurality of the memory cells of the first row of the array. In some examples, the plurality of memory cells are arranged in or on a substrate, and the first word line is formed in a first layer of the substrate and the second word line is formed in a second layer of the substrate.

20 Claims, 7 Drawing Sheets

MEMORY DEVICE WITH FLY WORD LINE

CROSS-REFERENCE TO RELATED APPLICATION

This application claims priority to U.S. Provisional Patent Application No. 62/654,977 filed Apr. 9, 2018, the disclosure of which is hereby incorporated by reference in its entirety.

BACKGROUND

Digital memory devices typically store data in the form of bits. For example, a static random access memory (SRAM) includes a memory array which includes multiple bit cells, each of which stores one bit of data. The multiple bit cells are arranged in a matrix of rows and columns. Bit cells in each row are connected to a word line and bit cells in each column are connected to a bit line pair. The bit line pair is used for accessing data from bit cells, with the word line controlling connections to the bit lines. During read and write operation, a word line is charged high activating bit cells attached to the word line. Data is read from a corresponding bit line pair of a targeted column.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
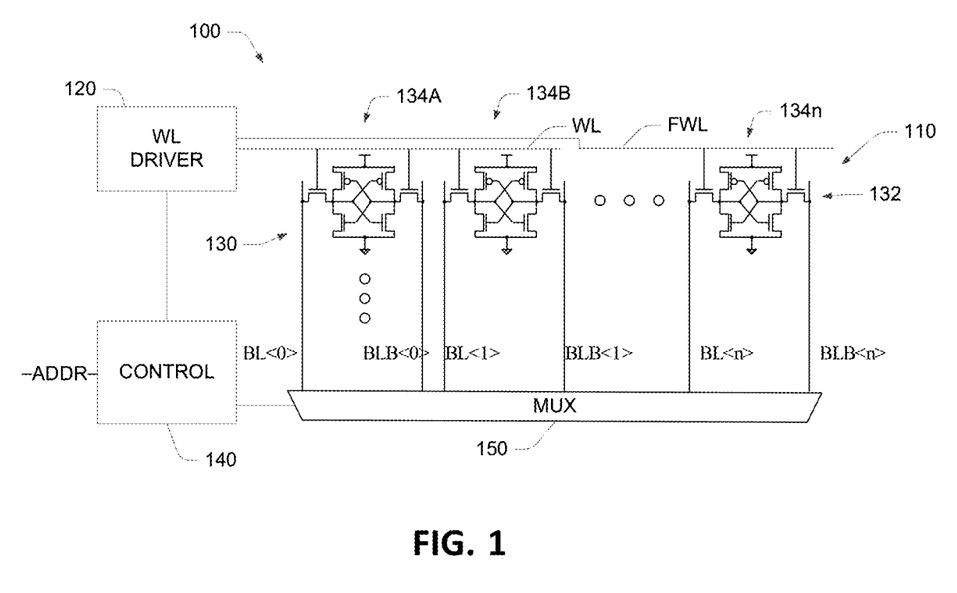
FIG. 1 is a block diagram of an example memory device in accordance with some embodiments.

FIG. 1 illustrates an example of a memory device 100 in accordance with various embodiments. In the illustrated embodiment of FIG. 1, the memory device 100 includes a memory cell matrix or array 110, a word line driver 120, a column multiplexer 150, and a controller 140. In some embodiments, the components of the memory device 100 are coupled to each other and to the controller 140 such that they are controlled by the controller 140. Further, for ease of illustration, the elements shown in FIG. 1 are shown as discrete components, though in some implementations some elements could be combined. For instance, the controller 140 could be configured so as to implement the word line driver 120.

In some embodiments, the memory cell array 110 includes a plurality of memory cells 130 that are arranged in a column-row configuration in which each column has a bit line (BL) and a bit bar line (BBL), and each row has a word line (WL). For ease of description, FIG. 1 shows one row 132 and three columns 134A, 134B and 134n (collectively referred to as rows 134). The bit lines BL<0:n> and BBL<0:n> of the corresponding columns 134A-134n are respectively coupled to a plurality of the memory cells 130 that are disposed in that column 134A-134n, and each memory cell 130 in that column 134 is arranged on a different row 132. That is, each memory cell 130 of the memory cell array 110 is coupled to a BL of a column of the memory cell array 110, a BBL of the column of the memory cell array 110, and a respective word line of a row of the memory cell array 110. As will be discussed further below, each row 132 includes first and second word lines. In some embodiments, the bit lines BL, BBL are arranged in parallel vertically and the word lines are arranged in parallel horizontally (i.e., perpendicular to the bit lines).

In some examples, the memory device 100 is a static random access memory (SRAM) device, and accordingly the memory cells 130 of the matrix or array 110 are SRAM cells that each include transistors connected between an upper reference potential and a lower reference potential such that one of two storage nodes can be occupied by the information to be stored, with the complementary information stored at the other storage node. For example, one typical SRAM memory cell arrangement includes six transistors. Each bit in the SRAM cell is stored on four of the transistors, which form two cross-coupled inverters. The other two transistors are connected to the memory cell word line WL to control access to the memory cell 130 during read and write operations by selectively connecting the cell to its bit lines BL, BLB. Other SRAM configurations are within the scope of this disclosure.

Figure 2:
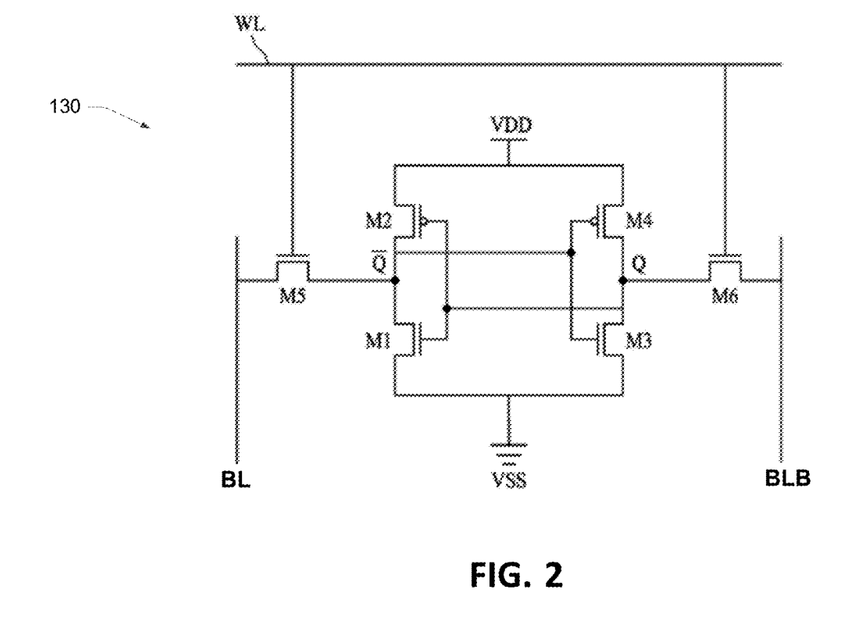
FIG. 2 is a circuit diagram of an example of an SRAM memory cell used in the embodiment of FIG. 1.

FIG. 2 is a circuit diagram illustrating an example SRAM cell 130 which may be employed in some disclosed embodiments. The memory cell 130 includes but is not limited to a six-transistor (6T) SRAM structure. In some embodiments more or fewer than six transistors may be used to implement the memory cell 130. For example, the memory cell 130 in some embodiments may use a 4T, 8T or 10T SRAM structure, and in other embodiments may include a memory-like bit-cell or a building unit. The memory cell 130 includes a first inverter formed by a NMOS/PMOS transistor pair M1 and M2, a second inverter formed by a NMOS/PMOS transistor pair M3 and M4, and access transistors/pass gates M5 and M6. Transistors M1, M3, M5 and M6 include n-type metal-oxide-semiconductor (NMOS) transistors, and transistors M2 and M4 include p-type metal-oxide semiconductor (PMOS) transistors.

The first and second inverters are cross coupled to each other to form a latching circuit for data storage. A first terminal of each of transistors M2 and M4 is coupled to a power supply VDD, while a first terminal of each of transistors M1 and M3 is coupled to a reference Voltage VSS, for example, ground.

A gate of the pass gate transistor M6 is coupled to the word line WL. A drain of the pass gate transistor M6 is coupled to the bit line BL. Moreover, a first terminal of the pass gate transistor M6 is coupled to second terminals of transistors M4 and M3 and also to gates of M2 and M1. Similarly, a gate of the pass gate transistor M5 is coupled to the word line WL. A drain of the pass gate transistor M5 is coupled to the complementary bit line BLB. Moreover, a first terminal of the pass gate transistor M5 is coupled to second terminals of transistors M2 and M1 and also to gates of transistors M4 and M3.

Data is written to and read from each of the SRAM cells 130 in each column 134 via the bit lines BL, BLB associated with each column of the memory array 110. The memory cells 130 are identified for reading and writing operations via a memory address sent by, for example, a central processing unit (CPU) of a computer and received by the controller 140. The address is decoded into a row and column address. The row address identifies a particular row 132 or word line WL in the array 110, and the column address identifies a particular column 134. The word line address is communicated by the word line driver 120 to the word lines WL to select the appropriate row 134 for read/write operations. The column address is communicated to the multiplexer (MUX) 150, which is configured to select a particular column 134 (bit lines BL, BLB) based on the column address.

In typical SRAM read operations, for example, an entire row 132 of cells 130 is activated based on the row address. Depending on the type of multiplexer 150 employed, however, only a small number of columns are actually selected for reading data. For example, with a 4-to-1 multiplexer, each multiplexer is coupled to four bit line pairs BL, BLB of the array 110 and is configured to select one of the bit line pairs BL, BLB in response to the column address. Thus, one fourth of the columns of the array 110 are actually selected, while the other three fourths of the columns are in a "dummy read," where the cells of the selected row are activated (i.e. access transistors turned on), but data are not read from these cells. With a typical 4-to-1 multiplexer arrangement used with a memory array having 256 columns (256 bit line pairs), 64 memory cells are actually selected so that 64 bits of data are input/output, while 192 memory cells are in a dummy read/write.

In other words, for an N-to-1 multiplexer (N is a positive integer representing the number of multiplexer inputs), N-1/N of the total columns are in dummy read. Such dummy read and write operations may result in unnecessary power consumption for the memory device, since only the selected column(s) for memory access are actually required to be activated in a single read/write operation. However, with conventional memory structures, an entire row of the memory array is under the same word line control. Thus, all memory cells on a given word line are activated when the given word line is selected.

Figure 3:
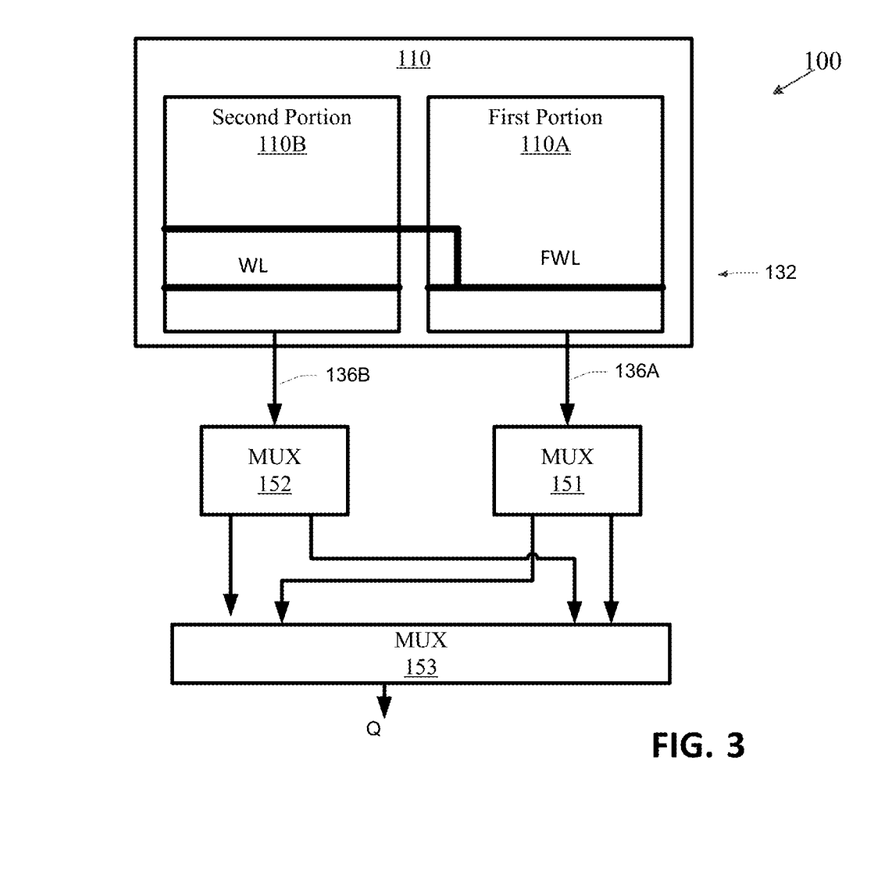
FIG. 3 is a block diagram illustrating an example of further aspects of the memory device of FIG. 1.

In some disclosed embodiments, each row 132 of the array 110 includes an additional word line, also referred to as a fly word line FWL herein. As shown in FIGS. 1 and 3, the memory cells 130 in respective rows 132 of the array 110 are separated into a first portion 110A and a second portion 110B such that the fly word line FWL is connected to a first plurality of the memory cells 130 of the row 132 of the array 110, while the word line WL is connected to a second plurality of the memory cells 130 of the row 132 of the array 110. Thus, the memory cells 130 of the first portion 110A of a given row 132 are activated by the fly word line FWL and the memory cells 132 of the second portion 110B of the given row 132 are activated by the word line WL. Since the word line WL extends to memory cells 130 of only the second portion 110B, it is shorter than the fly word line FWL that extends from the word line driver 120 to the memory cells 130 of the first portion 110A of the array 110.

It is noted that in some embodiments, the word lines WL and fly word lines FWL may each be connected to an equal number of memory cells. For example, some embodiments may include memory arrays 110 that have 256 columns of memory cells 130 (i.e. 256 bit line pairs BL, BLB). The memory array 110 is sectioned such that the word line WL and fly word line FWL of each row 132 are each connected to control 128 memory cells 130 in a given row 132. Other connection configurations of the word line WL and fly word line FWL are within the scope of the disclosure.

Figure 4:
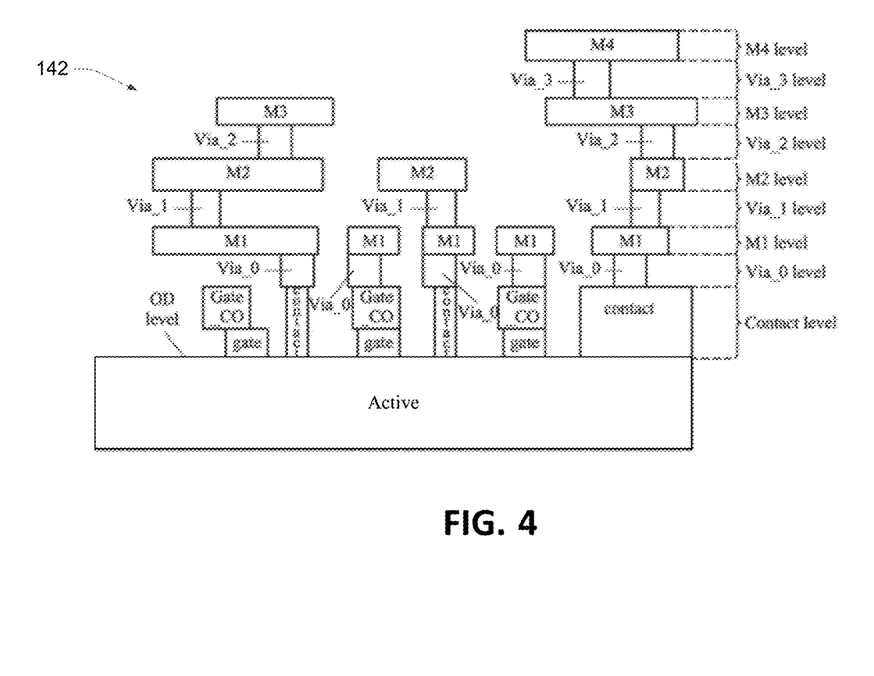
FIG. 4 is a block diagram illustrating examples of various layers of a memory device in accordance with some embodiments.

In some examples, the word lines WL and fly word lines FWL are located in separate layers of the memory device 100. FIG. 4 illustrates a schematic cross-sectional view of a plurality of layers 142 of the memory device 100. The illustrated layers 142 are formed in or on a substrate of a semiconductor chip. It is noted that FIG. 4 is schematically illustrated to show various layers and levels of interconnect structures and transistors, and may not reflect each structure, layer, connection, etc. of the actual memory device 100. The interconnect structure includes a contact level, an OD or "active region" level, various via levels Via_0, Via_1, Via_2, and Via_3, and metal-layer levels M1, M2, M3, and M4. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated transistors of the memory cells 130 to an overlying level such as the Via_0 level, and source/drain contacts (labeled as "contact" in FIG. 4) for connecting the source/drain regions of the transistors to the overlying level.

For example, the word lines WL may be formed in a first metal layer M1-M4, while the fly word lines may be formed in a different metal layer M1-M4. In some embodiments, for example, the first metal layer in which the word lines WL are formed is a metal layer Mx (where x is an integer identifying a given metal layer), and the second metal layer in which the fly word lines FWL are formed is Mx+2. In other words, second metal layer containing the fly word lines FWL is two metal layers away from the first metal layer in which the word lines WL are formed.

As noted above with reference to FIG. 1, the bit line pairs BL, BLB of the memory cells 130 are received by a multiplexer 150. More specifically, as shown in FIG. 3, the bit line pairs 136A of the first portion of the memory array 110A are coupled to a first multiplexer 151, while the bit lines 136B of the second portion of the memory array 110B are coupled to a second multiplexer 152. The outputs of the first and second multiplexers 151, 152 are coupled to a third multiplexer 153, which provides a data output Q. As will be discussed further below, the multiplexer arrangement allows "shuffling" the memory cell outputs for compatibility with standard memory output arrangements, among other things.

Figure 5:
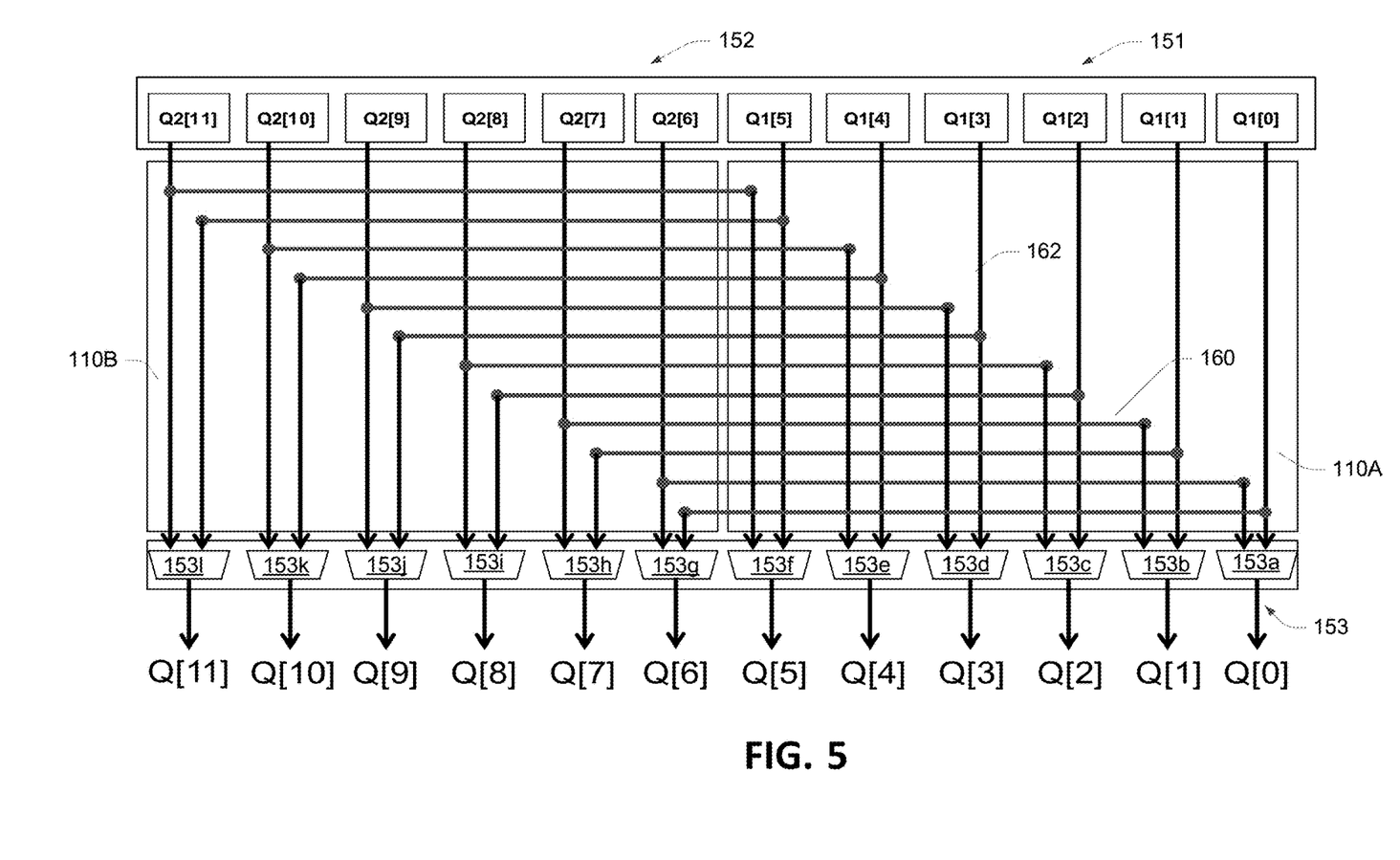
FIG. 5 is a block diagram illustrating an example of further aspects of the memory device of FIGS. 1 and 3.

FIG. 5 illustrates an example of interconnects between the first, second and third multiplexers 151, 152 and 153 in accordance with some disclosed embodiments. More specifically, the bit line pairs 136 of the first portion 110A and the second portion 110B of the memory array 110 are connected to a plurality of the first multiplexers 151 and a plurality the second multiplexers 152, respectively. A plurality of the third multiplexers 153 receive outputs from respective ones of the first and second multiplexers 151, 152. More specifically, each of the third multiplexers 153 has first and second inputs, with the first input of each of the third multiplexers 153 coupled to the output of one of the first multiplexers 151, and the second input of each of the third multiplexers 153 is coupled to the output of one of the second multiplexers 152.

Based on the memory address received by the controller 140, one of the word line WL or fly word line FWL may be activated such that data are read from the first portion 110A or the second portion 110B of the memory array 110. In some examples, only one of the word line WL or fly word line FWL is activated at a given time for a particular data read operation. In other words, in operation, only one of the word line WL and the fly word line FWL is activated at a given time in some embodiments. Accordingly, the third multiplexers 153 would receive inputs from only one of the first multiplexers 151 (i.e. memory cells 130 of the first portion 110A of the array) or second multiplexers 152 i.e. memory cells 130 of the second portion 110B of the array based on the memory address.

The example shown in FIG. 5, each of the first and second multiplexers 151, 152 is a 2-to-1 multiplexer and thus each of the first and second multiplexers has two inputs and one output. Other multiplexer arrangements are within the scope of the present disclosure. In the illustrated example, there are six of the first multiplexers 151 providing respective outputs Q1[0:5], and six of the second multiplexers 152 providing respective outputs Q2[6:11].

Further, the example of FIG. 5 includes 12 of the third multiplexers 153a-1 providing twelve respective outputs Q[0:11]. As noted above, each of the third multiplexers 153a-1 has its first input coupled to an output Q1[0:5] from one of the first multiplexers 151, and its second input coupled to an output Q2[6:11] from one of the second multiplexers 152. For instance, the third multiplexer 153a receives the output Q1[0] from the first multiplexers 151 and the output Q2[6] from the second multiplexers 152, the third multiplexer 153b receives the output Q1[1] from the first multiplexers 151 and the output Q2[7] from the second multiplexers 152, the third multiplexer 153c receives the output Q1[2] from the first multiplexers 151 and the output Q2[8] from the second multiplexers 152, the third multiplexer 153d receives the output Q1[3] from the first multiplexers 151 and the output Q2[9] from the second multiplexers 152, the third multiplexer 153e receives the output Q1[4] from the first multiplexers 151 and the output Q2[10] from the second multiplexers 152, and the third multiplexer 153f receives the output Q1[5] from the first multiplexers 151 and the output Q2[11] from the second multiplexers 152.

Similarly, the third multiplexer 153g receives the output Q1[0] from the first multiplexers 151 and the output Q2[6] from the second multiplexers 152, the third multiplexer 153h receives the output Q1[1] from the first multiplexers 151 and the output Q2[7] from the second multiplexers 152, the third multiplexer 153i receives the output Q1[2] from the first multiplexers 151 and the output Q2[8] from the second multiplexers 152, the third multiplexer 153j receives the output Q1[3] from the first multiplexers 151 and the output Q2[9] from the second multiplexers 152, the third multiplexer 153k receives the output Q1[4] from the first multiplexers 151 and the output Q2[10] from the second multiplexers 152, and the third multiplexer 153l receives the output Q1[5] from the first multiplexers 151 and the output Q2[11] from the second multiplexers 152.

As noted above, if 4-to-1 output multiplexers are employed in a conventional memory arrangement, ¾ of the memory cells are in a dummy read situation for any given read operation. If a typical memory system uses N-to-1 multiplexers (N is a positive integer representing the number of multiplexer inputs), disclosed examples using the word lines WL and fly word lines FWL replace the N-to-1 multiplexers with N/2-to-1 multiplexers. Thus, rather than employ typical 4-to-1 multiplexers, the first and second multiplexers 151, 152 are 2-to-1 multiplexers in the illustrated example. By providing the regular word line WL as well as the fly word line FWL to control the respective first and second sections of the memory array 110A, 110B, only half of the memory cells are in a dummy read during each read operation. In some examples, such as the embodiment shown in FIG. 5, the additional 2-to-1 third multiplexers 153 are provided to distribute the outputs Q1[0:5], Q2[6:11] of the first and second multiplexers 151, 152 in a more conventional manner across the 12 output terminals Q[0:11].

In disclosed embodiments, the word lines WL and fly word lines FWL of the memory array 110 may extend in a first direction (e.g. horizontally), while the bit lines 136 may extend in a second direction perpendicular to the first direction (e.g. vertically). In the example shown in FIG. 5, the conductors connecting the first multiplexers 151 and third multiplexers 153, and the conductors connecting the second multiplexers 152 and third multiplexers 153 include horizontal conductors 160 and vertical conductors 162. In other words, the horizontal conductors 160 extend parallel to the word lines WL and fly word lines FWL, while the vertical conductors 162 extend parallel to the bit lines 136. For example, the first input of the third multiplexer 153a is connected to the output Q1[0] from one of the first multiplexers 151 by a vertical conductor 162, while the second input of the third multiplexer 153a is connected to the output Q2[6] from one of the second multiplexers 152 by a horizontal conductor 160.

Moreover, the horizontal conductors 160 and vertical conductors 162 may be located in different layers of the device substrate in some examples. For instance, in some embodiments the horizontal conductors 160 are located in odd numbered metal layers (M1 or M3 layers in FIG. 4) while the vertical conductors 162 are located in even numbered metal layers (M2 or M4 in FIG. 4). Still further, in the example of FIG. 5, each of the horizontal conductors are approximately the same length, which helps reduce variations in access times among other things.

The data output is determined based on the memory address received by the controller 140. The inputs of the first multiplexers 151 may be connected to receive inputs from two memory cells 130 of the first portion of the memory array 110A via the respective bit line pairs 136A (see FIGS. 1 and 3). Similarly, the inputs of the second multiplexers 152 may be connected to receive inputs from two memory cells 130 of the second portion of the memory array 110B via the respective bit line pairs 136B.

Figure 6:
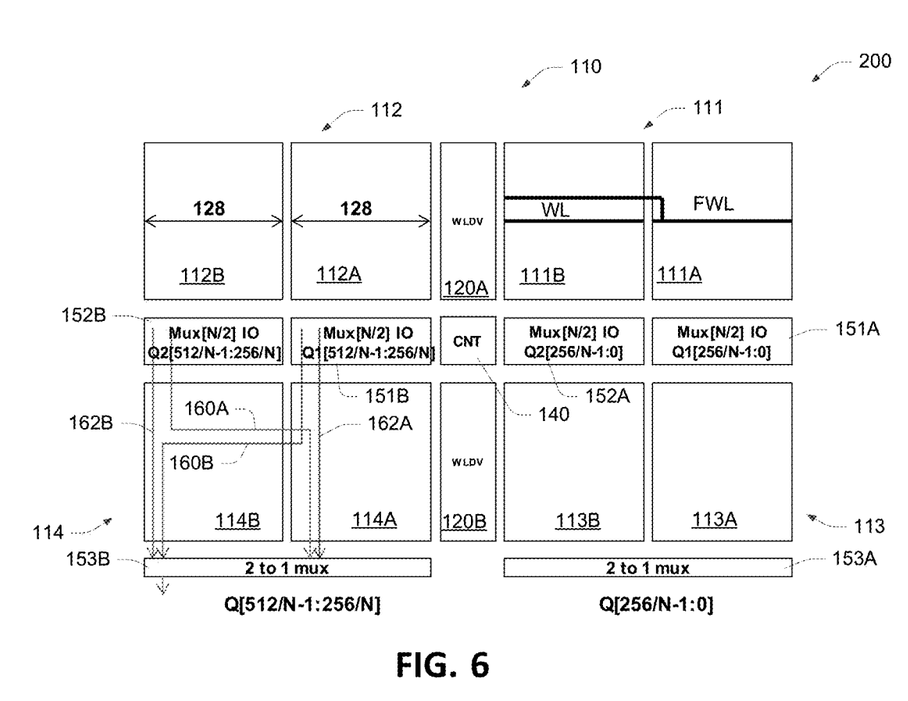
FIG. 6 is a block diagram of another example memory device in accordance with some embodiments.

FIG. 6 illustrates another example of a memory device 200, depicting a "butterfly" type design where the memory array 100 is divided into several sub arrays. More specifically, the sub arrays include two upper sub arrays 111 and 112 and two lower sub arrays 113 and 114. The upper sub arrays 111 and 112 are situated above a plurality of multiplexers, while the lower sub arrays 113 and 114 are situated below the multiplexers. This may allow shortening the length of the bit lines 136, in turn improving access time. As viewed in FIG. 6, the sub arrays 112 and 114 are situated to the left of upper and lower word line drivers 120a, 120b, while the sub arrays 111 and 113 are situated to the right of the word line drivers 120A, 120B.

The example shown in FIG. 6 has 512 bit line pairs, and each of the memory sub arrays 111, 112, 113, 114 has 256 bit line pairs. Further, each of the memory sub arrays 111, 112, 113, 114 include first and second portions 111A, 111B, 112A, 112B, 113A, 113B, 114A, 114B, each with 128 bit line pairs. The upper memory sub arrays 111, 112 are controlled by the word line driver 120A, the lower memory sub arrays 113, 114 are controlled by the word line driver 120B.

Each row of memory cells of the memory sub arrays 111, 112, 113, 114 are connected to a regular word line WL or a fly word line FWL as discussed above in conjunction with FIGS. 1 and 3. For ease of illustration, the word line WL and fly word line FWL are only illustrated for the first and second portions 111A, 111B of the first memory sub array 111. As with the memory array 110 shown in FIG. 3, a given word line WL is connected to a first plurality of the memory cells of a respective row in the first portion 111A of the first sub array 111, while the fly word line FWL is connected to a second plurality of the memory cells of the same row in the second portion 111B of the sub array 111. Thus, the memory cells of the first portion 111A of a given row are activated by the word line WL and the memory cells of the second portion 111B of the given row are activated by the fly word line FWL. The same is true for the other sub arrays 112, 113, 114 illustrated in FIG. 6.

In FIG. 6, a first plurality of the first multiplexers 151a are positioned between the first portions 111A, 113A of the memory sub arrays 111, 113, and a second plurality of the first multiplexers 151b are positioned between the first portions 112A, 114A of the memory sub arrays 112, 114. Similarly, a first plurality of the second multiplexers 152a are positioned between the second portions 111B, 113B of the memory sub arrays 111, 113, and a second plurality of the second multiplexers 152b are positioned between the second portions 112B, 114B of the memory sub arrays 112, 114

In the illustrated example, if the memory array 100, 200 is configured to replace a conventional memory array employing N-to-1 multiplexers, the first and second multiplexers 151, 152 would be N/2-to-1 multiplexers. Thus, as noted above, rather than N-1/N of the bit line pairs being in a dummy read situation, only N/2-1/N are in dummy read. Thus, where N=4, the first and second multiplexers 151, 152 are 2-to-1 multiplexers, and only half of the bit line pairs are in a dummy ready during a given read operation. As noted previously, the memory device 200 shown in FIG. 6 has 512 bit line pairs. The first multiplexers 151A are thus coupled to the 128 bit line pairs of the first portions 111A and 113A of the sub arrays 111 and 113. Further, the first multiplexers 151A provide outputs Q1[256/N-1:0]. The first multiplexers 151B are coupled to the 128 bit line pairs of the first portions 112A and 114A of the sub arrays 112 and 114, and provide outputs Q1[512/N-1:256/N]. The second multiplexers 152A are coupled to the 128 bit line pairs of the second portions 111B and 113B of the sub arrays 111 and 113, and the second multiplexers 152A provide outputs Q2[256/N-1:0]. The second multiplexers 152B are coupled to the 128 bit line pairs of the second portions 112B and 114B of the sub arrays 112 and 114, and provide outputs Q2[512/N-1:256/N]. The outputs of the first and second multiplexers 151A, 152A are received by the third multiplexers 153A, while the first and second multiplexers 151B, 152B are received the third multiplexers 153B. The third multiplexers 153A provide memory outputs Q[256/N-1:0], and the third multiplexers 153B provide memory outputs Q[512/N-1:256/N].

Continuing the example began above, if N=4, the first multiplexers 151A provide outputs Q1[63:0], the second multiplexers 152A provide outputs Q2[63:0], the first multiplexers 151B provide outputs Q1[127:64], and the second multiplexers 152B provide outputs Q2[127:64]. The third multiplexers 153A provide memory outputs Q[63:0], and the third multiplexers 153B provide memory outputs Q[127:64]. For ease of illustration, some example connections from the outputs Q1[127:64] and Q2[127:64] to the third multiplexers 153B are shown in FIG. 6.

As shown in FIG. 6, the third multiplexers 153A, 153B, which are 2-to-1 multiplexers, receive outputs from the first and second multiplexers 151A, 151B, 152A, 152B. A vertical conductor 162a, which is formed in one layer of the device substrate, extends directly from one of the first multiplexers 151B to connect an output Q1 to one of the third multiplexers 153B, while the output Q2 of one of the second multiplexers 152B is connected to an input of the third multiplexers 153B by a conductor formed in a different metal layer of the device substrate that includes a horizontal conductor 160a. Similarly, another vertical conductor 162b, which may be formed in the same layer of the device substrate as the conductor 162a, extends directly from one of the second multiplexers 152B to connect another output Q2 to another of the third multiplexers 153B. Another output Q1 of one of the first multiplexers 151B is connected to the input of another of the third multiplexers 153B by another horizontal conductor 160b, which may be formed in the same metal layer of the device substrate as the horizontal conductor 160a.

Figure 7:
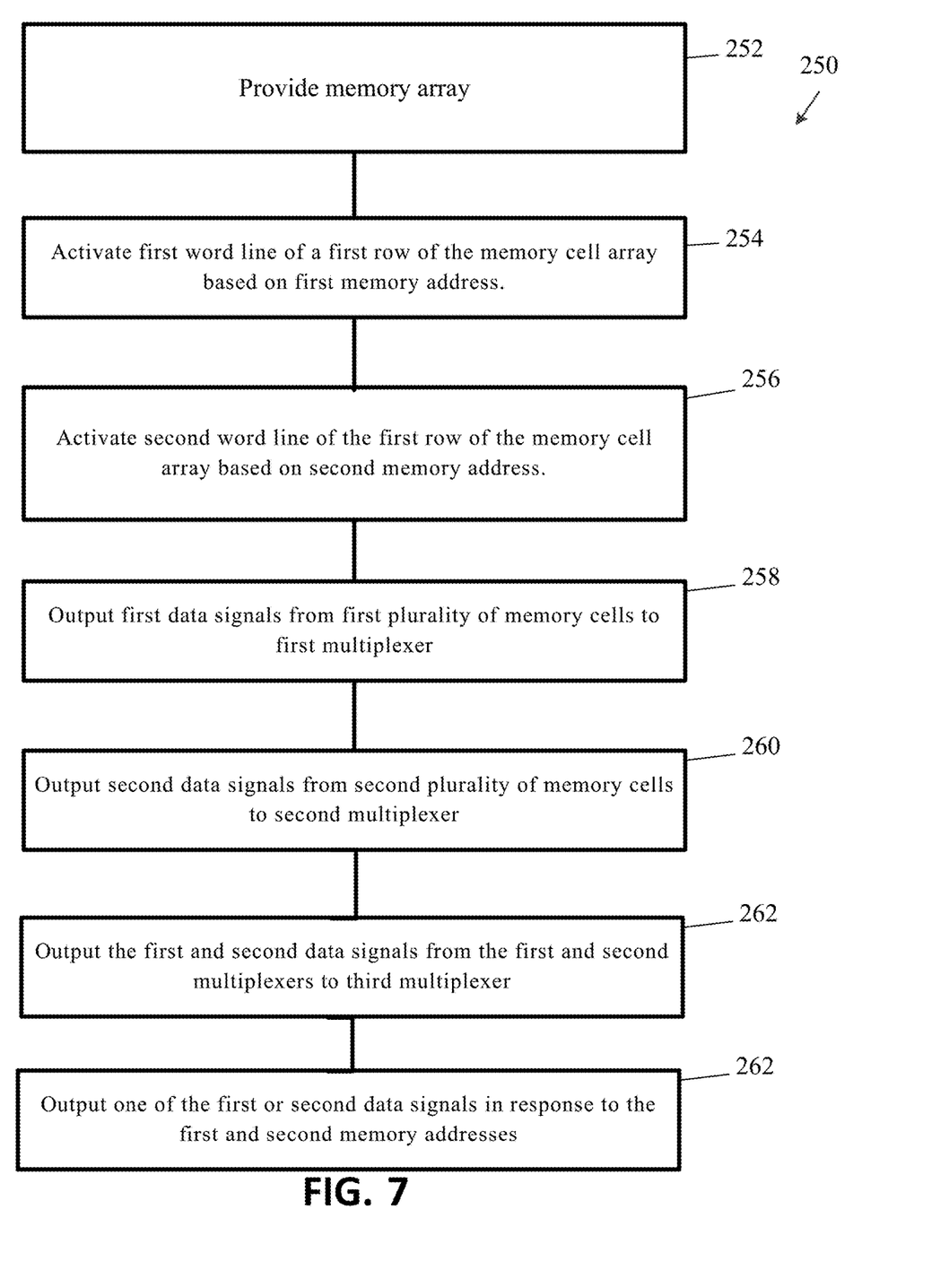
FIG. 7 is a flow diagram illustrating an example of a method in accordance with some embodiments.

FIG. 7 is a flow diagram illustrating a method of operating a memory device 250 in accordance with some disclosed embodiments. Referring to FIG. 7 along with FIGS. 1 and 3, at an operation 252, a memory array 110 is provided that has a plurality of memory cells 130 arranged in a matrix comprising a plurality of rows 132 and a plurality of columns 134. At operation 254, a first word line WL coupled to a first plurality of memory cells 110A of a first row 132 of the memory cell array 110 is activated in response to a first memory address. A second, or fly word line FWL that is coupled to a second plurality of memory cells 110B of the first row 132 of the memory cell array 110 is activated in response to a second memory address at operation 256. In other words, depending on the address received by the controller 140, the word line driver 120 activates the word line WL or fly word line FWL, which are both connected to the same row 132 to selectively activate memory cells 130 in either the first portion 110A or the second portion 110B of the memory array 110.

At operation 258, first data signals from the first plurality of memory cells 110A are output to a first multiplexer 151 in response to the first memory address. Second data signals from the second plurality of memory cells 110B are output to a second multiplexer 152 in response to the second memory address at operation 260. In other words, either the word line WL or fly word line FWL are activated to output data signals from the memory cells 130 on respective bit line pairs 136 to either the first or second multiplexers 151, 152 based on the received address. At operation 262, the first and second data signals from the first and second multiplexers 151, 152 are output to a third multiplexer 153, which outputs one of the first or second received data signals in response to the first and second memory addresses at operation 264.

Thus, according to embodiments, a memory device is provided that reduces power consumption by addressing dummy read situations. The memory device includes a plurality of memory cells arranged in an array having a plurality of rows and a plurality of columns. A first word line is connected to a first plurality of the memory cells of a first row of the array, and a second word line is connected to a second plurality of the memory cells of the first row of the array. In some examples, the plurality of memory cells are arranged in or on a substrate, and the first word line is formed in a first layer of the substrate and the second word line is formed in a second layer of the substrate.

According to further disclosed examples, a memory control system includes a controller configured to receive a memory address. A first word line is coupled is to the controller and is configured to activate a first plurality of memory cells of a first row of a memory cell array, and a second word line is coupled to the controller and configured to activate a second plurality of memory cells of the first row of the memory cell array. A first multiplexer is coupled to a bit line of a first memory cell of the first plurality of memory cells, and a second multiplexer is coupled to a bit line of a second memory cell of the second plurality of memory cells. A third multiplexer is coupled to the first and second multiplexers, and the controller is configured to activate one of the first or second word lines in response to the memory address.

According to still further examples, a method includes providing a memory array with a plurality of memory. A first word line coupled to a first plurality of the memory cells of a first row of the memory cell array is activated in response to a first memory address. A second word line coupled to a second plurality of the memory cells of the first row of the memory cell array is activated in response to a second memory address. First data signals from the first plurality of memory cells are output to a first multiplexer in response to the first memory address, and second data signals from the second plurality of memory cells are output to a second multiplexer in response to the second memory address. The first and second data signals are output to a third multiplexer, and one of the first or second data signals are output from the third multiplexer in response to the first and second memory addresses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a plurality of memory cells arranged in an array having a plurality of rows and a plurality of columns;
   a first word line having a first end and a second end, wherein the first end of the first word line is connected to a first plurality of the memory cells of a first row of the array; and
   a second word line having a third end and a fourth end, wherein the third end of the second word line is connected to a second plurality of the memory cells of the first row of the array;
   wherein the first word line is shorter than the second word line and the second end of the first word line is connected to a word line driver circuit and the fourth end of the second word line is also connected to the word line driver circuit; and
   wherein the plurality of memory cells are arranged in or on a substrate, and wherein the first word line is formed in a first layer of the substrate and the second word line is formed in a second layer of the substrate.

2. The memory device of claim 1, wherein a number of memory cells in the first plurality of memory cells equals a number of memory cells in the second plurality of memory cells.

3. The memory device of claim 1, wherein only one of the first word line and the second word line is activated at a given time.

4. The memory device of claim 3, further comprising:
   each of the memory cells including a bit line;
   a first multiplexer coupled to the bit lines of the first plurality of memory cells;
   a second multiplexer coupled to the bit lines of the second plurality of memory cells; and
   a third multiplexer coupled to the first and second multiplexers.

5. The memory device of claim 4, further comprising:
   a first conductor connecting an output of the first multiplexer to a first input of the third multiplexer;
   a second conductor connecting an output of the second multiplexer to a second input of the third multiplexer;
   wherein the first and second conductors are in separate layers of the substrate.

6. The memory device of claim 4, wherein the third multiplexer is configured to receive outputs from only first multiplexer in response to the received memory cell address.

7. The memory device of claim 4, wherein the third multiplexer is configured to receive outputs from only first plurality of bit lines in response to the received memory cell address.

8. The memory device of claim 1, further comprising a controller coupled to the word line driver circuit and configured to activate one of the first and second word lines in response to a received memory address.

9. The memory device of claim 1, wherein the memory device includes a static random access memory device.

10. The memory device of claim 9, wherein the first plurality of memory cells each include an access transistor coupled to the first word line, and wherein the second plurality of memory cells each include an access transistor coupled to the second word line.

11. A memory control system, comprising:
a controller configured to receive a memory address;
a first word line coupled to the controller and configured to selectively activate a first plurality of memory cells of a first row of a memory cell array;
a second word line coupled to the controller and configured to selectively activate a second plurality of memory cells of the first row of the memory cell array;
a first multiplexer coupled to a bit line of a first memory cell of the first plurality of memory cells;
a second multiplexer coupled to a bit line of a second memory cell of the second plurality of memory cells; and
a third multiplexer coupled to the first and second multiplexers;
wherein the controller is configured to activate one of the first or second word lines in response to the memory address.

12. The system of claim 11, wherein the first word line is formed in a first layer of a substrate and the second word line is formed in a second layer of the substrate.

13. The system of claim 11, further comprising:
a first conductor connecting an output of the first multiplexer to a first input of the third multiplexer;
a second conductor connecting an output of the second multiplexer to a second input of the third multiplexer;
wherein the first and second conductors are in separate layers of the substrate.

14. The system of claim 13, wherein:
the first conductor extends parallel to the bit lines directly from the first multiplexer to the first input of the third multiplexer;
the second conductor includes a first section extending parallel to the bit lines, and a second section extending parallel to the word lines.

15. The system of claim 14, further comprising:
a plurality of the first multiplexers coupled to preselected bit lines of the first plurality of memory cells;
a plurality of second first multiplexers coupled to preselected bit lines of the second plurality of memory cells;
a plurality of the third multiplexers, wherein the first input of each of the third multiplexers is coupled to one of the first multiplexers and the second input of each of the third multiplexers is coupled to one of the second multiplexers;
a plurality of the first conductors connecting the output of a respective one of the first multiplexers to the first input of a respective one of the third multiplexers, wherein each of the first conductors extends parallel to the bit lines;
a plurality of the second conductors connecting the output of a respective one of the second multiplexers to the second input of the respective one of the third multiplexers, wherein each of the second conductors includes the first section extending parallel to the bit lines and the second section extending parallel to the word lines, and wherein each of the second sections of the second conductors is approximately the same length.

16. The system of claim 11, wherein the controller is configured to output signals from only one of the first or second multiplexer to the third multiplexer in response to the memory address.

17. The system of claim 11, wherein the third multiplexer is a 2-to-1 multiplexer.

18. A method, comprising:
activating a first word line coupled to a first plurality of memory cells of a first row of a memory cell array in response to a first memory address;
activating a second word line coupled to a second plurality of the memory cells of the first row of the memory cell array in response to a second memory address;
outputting first data signals from the first plurality of memory cells to a first multiplexer in response to the first memory address;
outputting second data signals from the second plurality of memory cells to a second multiplexer in response to the second memory address;
outputting the first and second data signals to a third multiplexer;
outputting one of the first or second data signals from the third multiplexer in response to the first and second memory addresses.

19. The method of claim 18, wherein only one of the first word line and the second word line is activated at a given time.

20. The method of claim of claim 18, wherein the third multiplexer is a 2-to-1 multiplexer.

* * * * *